(12) United States Patent
Kaajakari

(10) Patent No.: US 10,476,476 B2
(45) Date of Patent: Nov. 12, 2019

(54) MEMS RESONATOR WITH SUPPRESSED SPURIOUS MODES

(71) Applicant: Murata Manufacturing Co., Ltd., Nagaokakyo-shi, Kyoto-fu (JP)

(72) Inventor: Ville Kaajakari, Altadena, CA (US)

(73) Assignee: MURATA MANUFACTURING CO., LTD., Nagaokakyo-Shi, Kyoto-Fu (JP)

(*) Notice: Subject to any disclaimer, the term of this patent is extended or adjusted under 35 U.S.C. 154(b) by 285 days.

(21) Appl. No.: 15/380,119

(22) Filed: Dec. 15, 2016

(65) Prior Publication Data
US 2018/0175825 A1 Jun. 21, 2018

(51) Int. Cl.
| | |
|---|---|
| H03H 9/02 | (2006.01) |
| H03H 9/15 | (2006.01) |
| H03H 9/24 | (2006.01) |
| H01L 41/09 | (2006.01) |
| H01L 41/047 | (2006.01) |
| H03H 9/17 | (2006.01) |

(52) U.S. Cl.
CPC ...... *H03H 9/2405* (2013.01); *H03H 9/02275* (2013.01); *H03H 9/02433* (2013.01); *H03H 9/171* (2013.01); *H01L 41/0477* (2013.01); *H01L 41/0913* (2013.01); *H03H 9/02157* (2013.01); *H03H 2009/02503* (2013.01); *H03H 2009/155* (2013.01); *H03H 2009/241* (2013.01)

(58) Field of Classification Search
CPC .......... H03H 9/2405; H03H 2009/155; H03H 2009/02503; H03H 9/02275; H03H 9/205; H03H 9/02244; H03H 9/02433; H03H 9/171; H03H 9/02157; H03H 2009/241; H01L 41/0477; H01L 41/0478; H01L 41/0913

USPC .................................................. 310/311–371
See application file for complete search history.

(56) References Cited

U.S. PATENT DOCUMENTS

| | | | |
|---|---|---|---|
| 5,548,180 A | 8/1996 | Kaida | |
| 5,892,416 A * | 4/1999 | Unami | H03H 9/1014 333/187 |
| 7,898,158 B1 * | 3/2011 | Li | H03H 9/02275 310/320 |
| 9,318,998 B1 * | 4/2016 | Tabrizian | H03B 5/323 |
| (Continued) | | | |

FOREIGN PATENT DOCUMENTS

WO WO2016114237 A1 7/2016

OTHER PUBLICATIONS

Ho et al.; "High-Order Composite Bulk Acoustic Resonators"; Micro Electro Mechanical Systems, 2007, IEEE 20th International Conference on Jan. 21-25, 2007.

*Primary Examiner* — Jue Zhang
*Assistant Examiner* — David A. Singh
(74) *Attorney, Agent, or Firm* — Arent Fox LLP

(57) ABSTRACT

A MEMS resonator is provided with improved electrical characteristics and reduced spurious resonances. The MEMS resonator includes two or more first rectangular resonator plates with lengths greater than their respective widths. Moreover, the MEMS resonator includes two or more second rectangular resonator plates that are positioned parallel to the first resonator plates in the widthwise direction of the MEMS resonator. The length of the second resonator plates is different than the length of the first resonator plates to reduce spurious resonances.

20 Claims, 12 Drawing Sheets

(56) References Cited

U.S. PATENT DOCUMENTS

| | | | | |
|---|---|---|---|---|
| 2005/0242904 | A1* | 11/2005 | Lutz | H03H 3/0077 333/200 |
| 2006/0044078 | A1* | 3/2006 | Ayazi | H03H 3/0077 333/186 |
| 2006/0090328 | A1* | 5/2006 | Kawashima | H03H 3/02 29/594 |
| 2008/0111651 | A1* | 5/2008 | Isobe | H03H 3/02 333/187 |
| 2010/0109810 | A1* | 5/2010 | Hashimura | H03H 9/02244 333/197 |
| 2011/0284995 | A1* | 11/2011 | Kuypers | B81B 7/02 257/622 |
| 2012/0139665 | A1* | 6/2012 | Perez | H01L 41/08 333/193 |
| 2012/0188023 | A1* | 7/2012 | Rottenberg | H03H 9/02338 331/156 |
| 2013/0033338 | A1* | 2/2013 | Wang | H03H 3/0072 333/186 |
| 2013/0120080 | A1* | 5/2013 | Park | H03H 9/54 333/186 |
| 2014/0355089 | A1* | 12/2014 | Murayama | G02B 26/0841 359/199.4 |
| 2015/0115777 | A1* | 4/2015 | Yun | H03H 9/17 310/366 |
| 2015/0266724 | A1* | 9/2015 | Quevy | H03H 3/0076 438/488 |
| 2017/0093361 | A1* | 3/2017 | Grosjean | H03H 9/125 |
| 2018/0183403 | A1* | 6/2018 | Kaajakari | H03H 9/02433 |

* cited by examiner

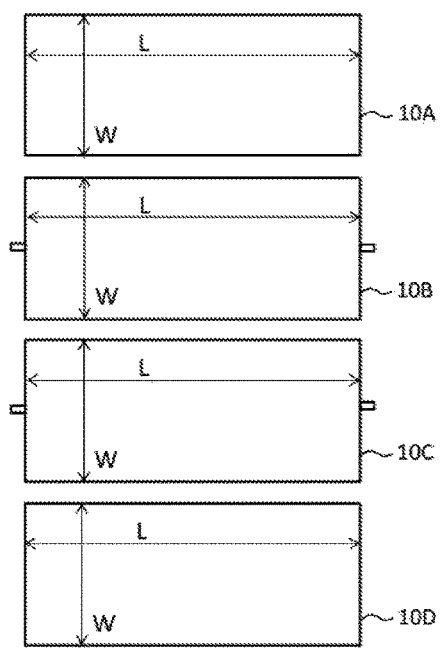
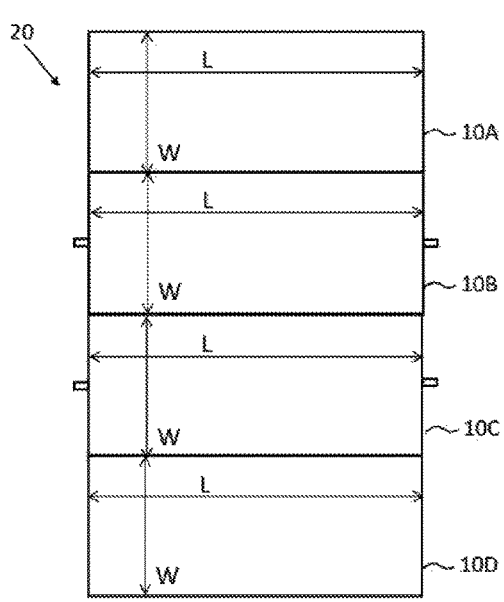
Fig. 3A
(Prior Art)
Fig. 3B
(Prior Art)

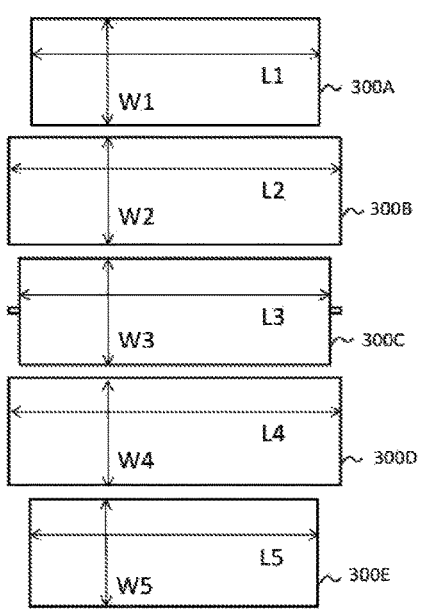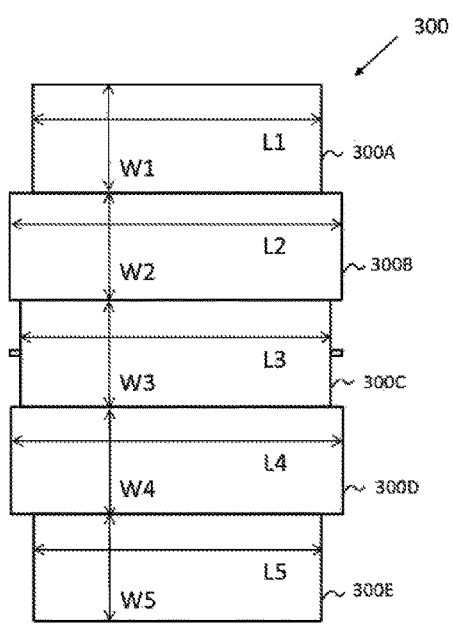
Fig. 7A
Fig. 7B

MEMS RESONATOR WITH SUPPRESSED SPURIOUS MODES

FIELD OF THE INVENTION

The present invention relates generally to a MEMS resonator, and, more particularly, to a MEMS resonator with reduced spurious modes.

BACKGROUND OF THE INVENTION

Microelectromechanical system ("MEMS") resonators are small electromechanical structures that vibrate at high frequencies and are often used for timing references, signal filtering, mass sensing, biological sensing, motion sensing, and other applications. MEMS resonators are considered a common alternative to quartz timing devices to provide an accurate time or frequency reference. In general, quartz resonators have a high quality factor and piezoelectric coupling. High quality factor indicates a low rate of energy loss relative to the stored energy of the resonator, i.e., the oscillations die out more slowly. However, one limitation for quartz resonators is that they are difficult to design in smaller sizes.

Typically, MEMS resonators are made of silicon using lithography based manufacturing processes and wafer level processing techniques. Designers and manufacturers have found that pure silicon resonators often demonstrate very high quality factors comparable to quartz crystals. However, bare silicon is not piezoelectric and pure silicon resonators have high motional impedance making them unsuitable to replace quartz resonators in many applications.

In order to lower the motional impedance of MEMS resonator, some designs have added piezoelectric material, such as a layer of thin film of aluminum nitride (AlN). A typical piezoelectric micromechanical resonator is shown in FIGS. 1A and 1B.

In particular, FIG. 1A illustrates a top view of a conventional resonator 10 that is rectangular shaped and includes two smalls anchor 11A and 11B on the sides of the resonator to mount the resonator.

FIG. 1B illustrates a cross sectional view of the conventional resonator 10. Typically, the resonator 10 is manufactured of silicon using MEMS manufacturing techniques. On top of silicon substrate 12, the resonator 10 has a piezoelectric thin film 16 sandwiched between two metal electrodes 14A and 14B to provide piezoelectric coupling. In an exemplary design, the metal electrodes 14A and 14B are typically molybdenum, but other materials such as platinum or aluminum may also be used. Moreover, the piezoelectric film 16 may be aluminum nitride (AlN) or doped aluminum nitride, but may also be PZT or titanium oxide.

In conventional designs, the thickness of the metal electrodes 14A and 14B is typically 50 nanometers (nm) to 400 nm and the thickness of the piezoelectric film 16 is typically 400 nm to 2 um. Moreover, the thickness of the silicon substrate 12 may range from 3 μm to 30 μm, for example. Although not shown, additional thin film layers may also be present in some conventional designs. For example, a layer of silicon dioxide thin film can be used to change the temperature coefficient of frequency of the resonator.

To maximize the resonator quality factor, resonators are preferably designed to resonate in a bulk mode where the resonator deforms mainly in the in-plane vibration mode where the out-of-plane movement is minimized. In particular, it is desirable that out-of-plane bending modes of the resonator are avoided since these modes have low quality factors at high frequencies.

In general, lateral dimensions of resonators will determine the resonator's resonance frequency and are also important in designing high quality factor resonators. Typically, a resonator with a high quality factor has a rectangular shape with width W and length L, for example as shown in FIG. 2. In particular, FIG. 2 illustrates a top view of a width extensional resonator 10 according to a conventional design. As shown, the vibrational motion of the resonator 10 is mainly in the width direction (i.e., contraction and expansion vibration). This width extensional mode is preferred since the anchoring points 11A and 11B on the short sides of the resonator have minimal movement, thereby minimizing the anchor losses and maximizing the quality factor.

Moreover, it is known that certain aspect ratios ("AR"), defined as the ratio of length L to width W (i.e., AR=L/W), minimize the mounting losses and therefore maximize the quality factor, for example, as described in Patent Document 1, identified below. In particular, an optimal aspect ratio ranges from 1.2 to 1.8 depending on material properties and is typically around 1.5 for silicon based resonators.

Furthermore, the resonance frequency is inversely related to the resonator width. Thus, as the width and length of the resonator 10 is reduced, the resonant frequency is correspondingly increased. However, the small size of such a resonator will result in higher electrical impedance that is undesirable. One way to reduce the electrical impedance of a high frequency resonator is to increase the aspect ratio by an integer multiple N so that the aspect ratio is approximately N×1.5 (with 1.5 being an example of an optimal aspect ratio). For example, good choices for the aspect ratio are 1.5, 3.0, 4.5, 6.0, 7.5, and so on, with the exact value that minimizes the anchor movement being determined by simulation or experiments.

Moreover, the resonator impedance can be decreased even further by combining two or more rectangular shaped resonators along the long edge to make a higher order overtone resonator, as described in Non-patent Document 1, for example, identified below.

FIG. 3A illustrates a higher order overtone resonator according to a conventional design. As shown, the resonator design includes four plate resonators 10A, 10B, 10C and 10D, with the resonator outer shape for each resonator being rectangular with a length L and a width W that is selected to achieve an aspect ratio AR=L/W=6. Moreover, FIG. 3B illustrates the resulting overtone resonator 20 according to the conventional design shown in FIG. 3A. As shown, the four resonators 10A-10D are connected and aligned along the long edge with length L to make a fourth-order overtone width-extensional mode resonator. Although four resonators are shown for this design, the technique can be extended to even higher order, for example, where 50 or even 100 or more plates can be connected together in this manner. Of course, one obvious drawback of this approach is that as the overall resonator dimensions become large, which, in turn, increases the number of undesirable out-of-plate bending modes during operation. These modes may be close in frequency to the desired in-plane mode and can result in spurious impedance response.

FIG. 3C illustrates an electrode pattern for the overtone resonator 20 shown in FIG. 3B. As shown, resonators 10A and 10C share the same top electrode 22A (i.e., top electrode 1) and resonators 10B and 10D share another top electrode 22B (i.e., top electrode 2). It is known that many different electrode patterns can be employed, for example, as disclosed in Patent Document 2, identified below.

FIGS. 4A and 4B illustrate graphs of exemplary electrical resonator responses. The electrical responses are shown as impedance to frequency. As shown, for example, a clean impedance curve is illustrated in FIG. 4A where one clear impedance resonance is observed. In contrast, a spurious impedance curve is shown in FIG. 4B where an additional spurious resonance is observed following the main resonance. This type of spurious response is due to bending modes near the main width-extensional mode and it is very detrimental to resonator performance in time and frequency applications. Moreover, the resonance frequency of the out-of-plane bending modes is sensitive to small manufacturing variations and it may not be possible to completely eliminate these modes around the main resonance by adjusting the resonator thickness and aspect ratio. In manufacturing, this may result in yield loss where some resonators work as desired and some resonators exhibit the undesirable spurious response.

Patent Document 1: U.S. Pat. No. 5,548,180.
Patent Document 2: WO 2016/114237.
Non-patent Document 1: Ho, et al., "High-order composite bulk acoustic resonators", Micro Electro Mechanical Systems, 2007. IEEE 20th International Conference on. IEEE, 2007.

SUMMARY OF THE INVENTION

Accordingly, the MEMS resonator disclosed herein is provided to improve electrical characteristics while reducing spurious resonances observed in conventional MEMS designs.

Thus, according to one aspect, a MEMS resonator is provided that includes a plurality of first resonator plates each having a width W1 and a length L1, wherein the length L1>the width W1; and a plurality of second resonator plates each having a width W2 and a length L2, wherein the length L2>the width W2. Moreover, the plurality of first resonator plates and the plurality of second resonator plates are disposed parallel to each other in a widthwise direction of the MEMS resonator, and the length L1 does not equal the length L2.

In a variation of this aspect, the plurality of second resonator plates comprise at least a pair of second resonator plates that are respectively disposed adjacent to outer sides in the widthwise direction of a pair of the plurality of first resonator plates.

In another variation of this aspect, the pair of first resonator plates are disposed adjacent to each other at respective inner sides in the widthwise direction of the first resonator plates, the inners sides being opposite to the outer sides.

In another variation of this aspect, the MEMS resonator comprises a symmetric shape such that the plurality of second resonator plates are aligned symmetrically relative to the plurality of first resonator plates in the widthwise direction.

In another variation of this aspect, the length L2 of each of the second resonator plates is substantially equal to 0.98× the length L1 of the first resonator plates.

In another variation of this aspect, the width W1 of each of the first resonator plates is substantially equal to the width W2 of each of the second resonator plates.

In another variation of this aspect, the MEMS resonator further includes at least one third resonator plate having a length L3 that is not equal to the length L1 or the length L2.

In another aspect, a MEMS resonator is provided that includes a plurality of inner resonator plates each having a width W1 and a length L1 that is greater than the width W1, wherein the inner resonator plates are disposed adjacent to each other along respective first sides of the inner resonator plates; and a plurality of outer resonator plates each having a width W2 and a length L2 that is greater than the width W2, wherein at least a pair of the outer resonator plates are disposed adjacent to respective second sides of a pair of the inner resonator plates. In this aspect, the second sides of the pair of inner resonator plates are opposite the first sides, respectively, in the widthwise direction of the MEMS resonator, and the length L1 does not equal the length L2.

In another aspect, a MEMS resonator is provided that includes a plurality of first resonator plates each being rectangular shaped and having a pair of longer sides with a length L1 and a pair of shorter sides with a width W1, wherein the length L1>the width W1; and a plurality of second resonator plates each having a pair of first sides extending in a direction parallel to each other and a pair of second sides connecting the pair of first sides, respectively, the pair of second sides not extending in a direction parallel to each other. In this aspect, the plurality of first resonator plates and the plurality of second resonator plates are disposed parallel to each other in a widthwise direction of the MEMS resonator.

The above simplified summary of example embodiments serves to provide a basic understanding of the present disclosure. This summary is not an extensive overview of all contemplated aspects, and is intended to neither identify key or critical elements of all aspects nor delineate the scope of any or all aspects of the present disclosure. Its sole purpose is to present one or more aspects in a simplified form as a prelude to the more detailed description of the disclosure that follows. To the accomplishment of the foregoing, the one or more aspects of the present disclosure include the features described and particularly pointed out in the claims.

BRIEF DESCRIPTION OF THE DRAWINGS

The accompanying drawings, which are incorporated into and constitute a part of this specification, illustrate one or more example embodiments of the present disclosure and, together with the detailed description, serve to explain their principles and implementations. The drawings provided are for illustrative purposes only and are therefore not drawn to scale.

FIG. 3A illustrates a higher order overtone resonator according to a conventional design.

FIG. 3B illustrates a resonator according to the conventional design shown in FIG. 3A.

FIGS. 7A and 7B illustrate a top view of a MEMS resonator according to yet another exemplary embodiment.

DETAILED DESCRIPTION OF THE EXEMPLARY EMBODIMENTS

According to the exemplary embodiments described herein, MEMS resonator designs are provided to improve electrical characteristics, such as quality factor, while reducing spurious resonances observed in conventional MEMS designs. In particular, the exemplary resonators have varied outer shapes of individual resonator plates used in constructing the overtone resonator. As a result, undesirable spurious modes are suppressed without affecting other critical resonator parameters such as quality factor. Moreover, by making the overtone resonator from individual resonators with slightly dissimilar outer shapes, the bending resonances are moved to other frequencies and the electrical coupling is reduced. For example, by varying the length of the individual rectangular plates that comprise the overtone resonator, the spurious modes are effectively suppressed.

Those of ordinary skill in the art will realize that the following description is illustrative only and is not intended to be in any way limiting. Other aspects will readily suggest themselves to those skilled in the art having the benefit of this disclosure. Reference will now be made in detail to implementations of the example aspects as illustrated in the accompanying drawings. The same reference indicators will be used to the extent possible throughout the drawings and the following description to refer to the same or like items.

Figure 5A:
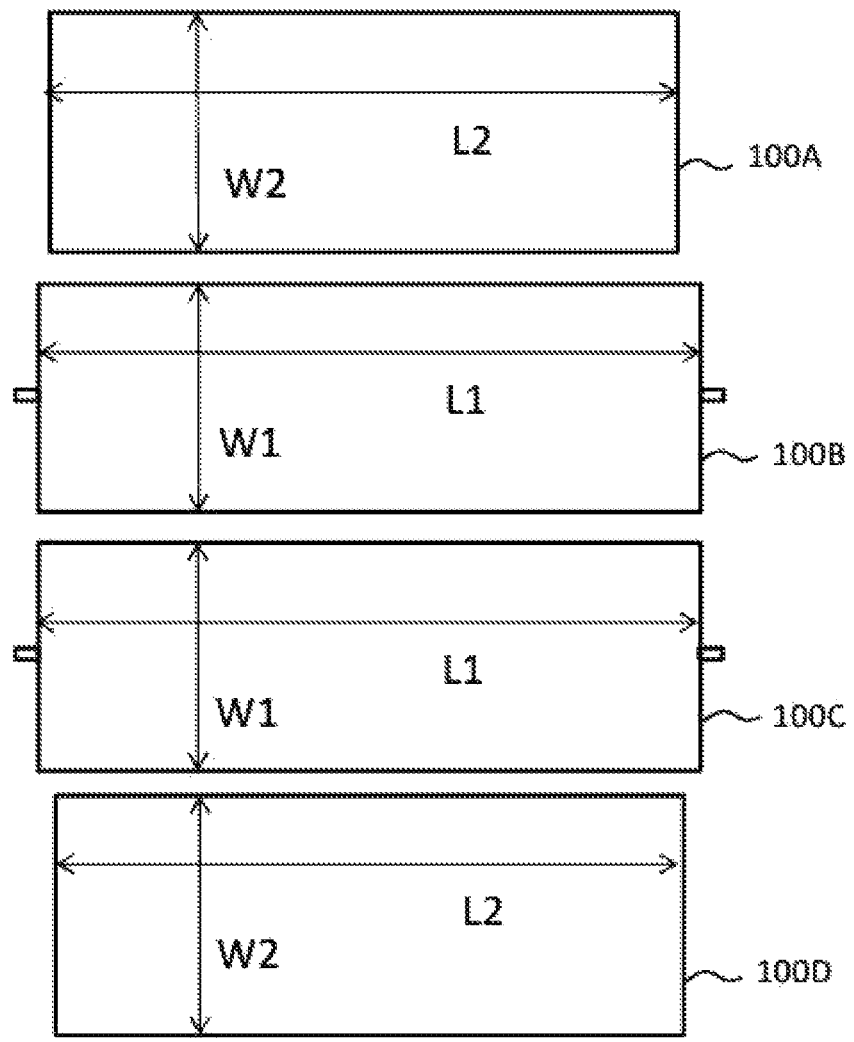
FIGS. 5A and 5B illustrate a top view of a MEMS resonator according to an exemplary embodiment.
Figure 5B:
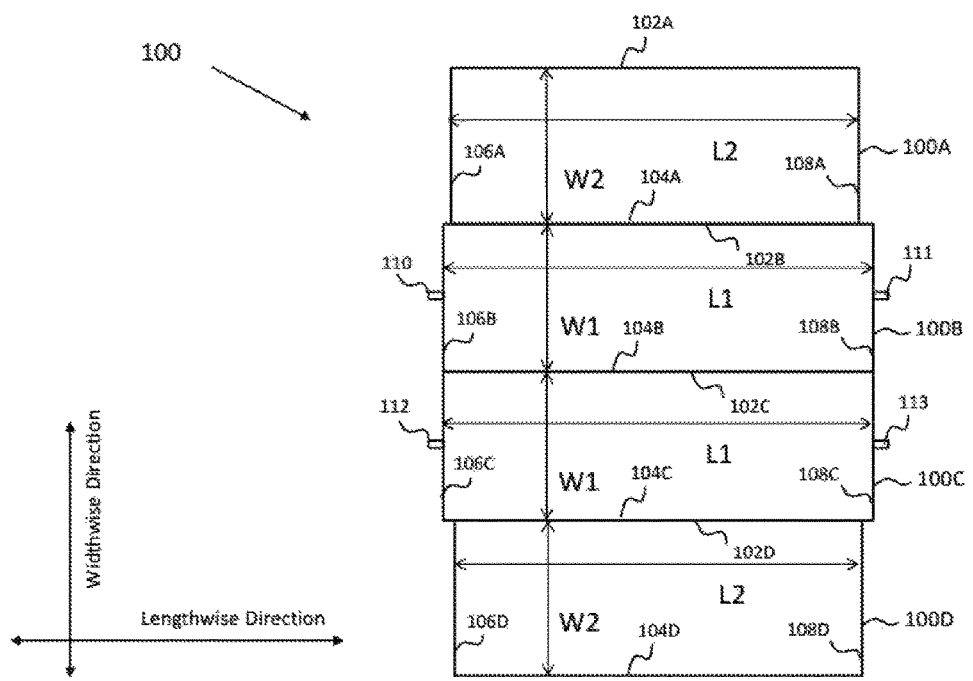

FIGS. 5A and 5B illustrate a MEMS resonator according to an exemplary embodiment. As shown, an overtone resonator 100 is provided that includes a plurality of individual resonator plates 100A, 100B, 100C and 100D. It is noted that the term "resonator plates" is used interchangeably with the concept of individual resonators for the MEMS overtone resonators disclosed herein. Accordingly, to the exemplary embodiment, each of the individual resonators 100A-100D comprises an outer shape that is substantially rectangular shaped. In general, it is contemplated that the term "substantially" as is used herein takes into account minor variations in the resonator shape that may occur during the manufacturing process. For example, according to one embodiment, the resonator plates 100A and 100D are designed to have identical or substantially identical dimensions, and the resonator plates 100B and 100C are designed to have identical or substantially identical dimensions. However, the machines uses to deposit and etch the layers during the MEMS manufacturing process may lead to slight differences in these dimensions. Thus, the term "substantially" takes into account resulting variances in dimensions due to variations in the manufacturing equipment.

Figure 1A:
FIGS. 1A and 1B illustrate a conventional piezoelectric micromechanical resonator.
Figure 1B:
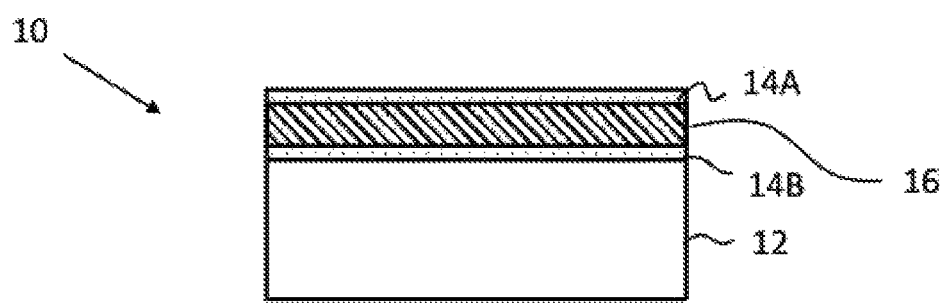
Figure 2:
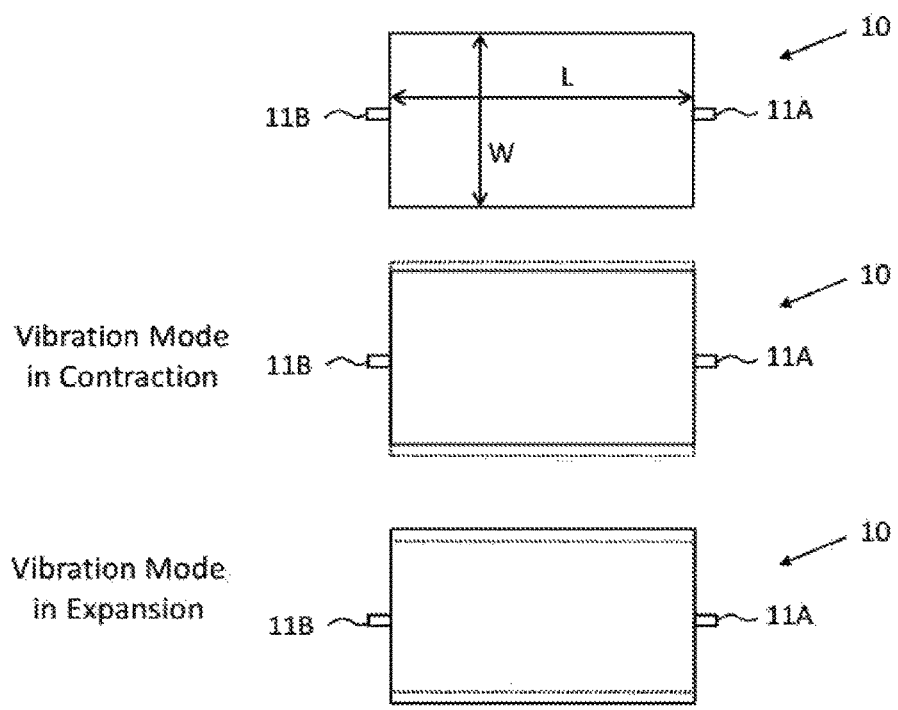
FIG. 2 illustrates a top view of a width extensional resonator according to a conventional design.

Moreover, in one aspect, each of the resonator plates can be processed from the same layer of an SOI wafer (i.e., the structural layer). It should also be understood that while not shown, each of the resonator plates can include a piezoelectric thin film sandwiched between two metal electrodes to provide piezoelectric coupling, such as the conventional design shown in FIG. 1B. Moreover, according to an exemplary embodiment, the silicon surface is in the [001] crystal direction and the c-axis (i.e., the crystallographic axis) of the piezoelectric thin film is aligned along the thickness direction. Furthermore, the resonator plates can have an orientation with the width direction of the plate aligned either to the [100] silicon crystal direction or the [110] silicon crystal direction.

Figure 3C:
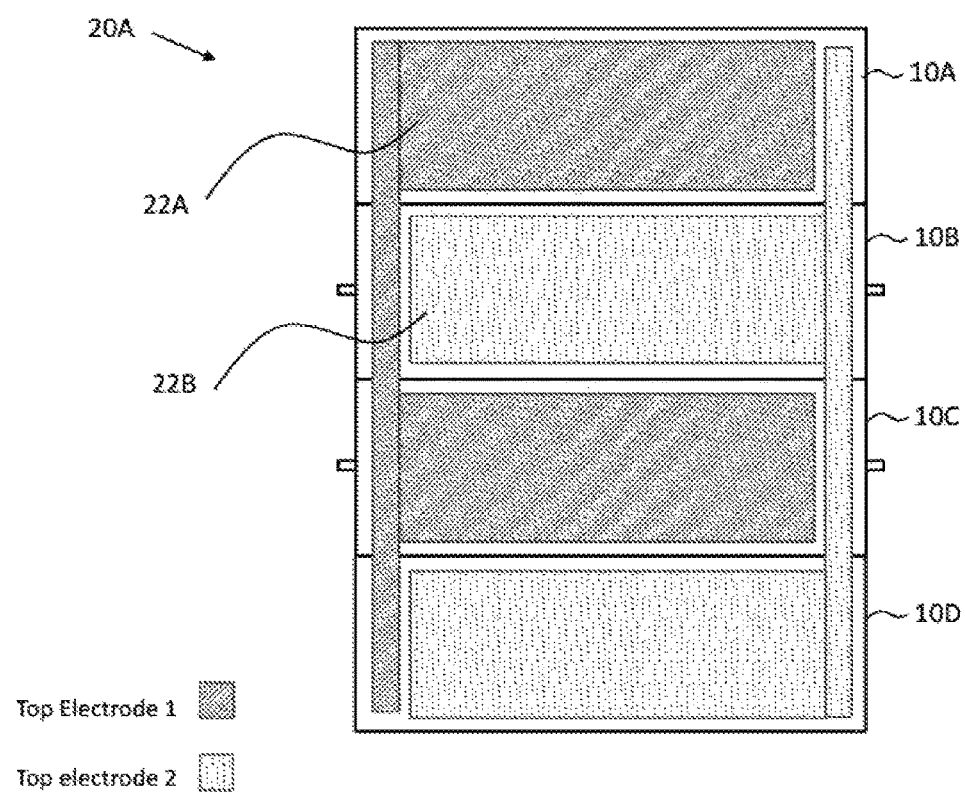
FIG. 3C illustrates an electrode pattern for the resonator shown in FIG. 3B.

The metal electrodes can be formed by molybdenum, platinum or aluminum, for example. Moreover, the resonator plates are coupled in parallel according to electrical connections, such as the design illustrated in FIG. 3C, and discussed above. The specific electrical connection configuration is not critical to the exemplary MEMS resonators disclosed herein and will not be described in further detail.

In any event, resonator plates 100A and 100D can be considered "outer" resonators and a first pair of resonator plates, while resonator plates 100B and 100C can be considered "inner" resonators and a second pair of resonator plates. According to the exemplary embodiment, the inner resonator plates 100B and 100C have length L1=6×W1, i.e., the aspect ratio is 6. Moreover, the outer resonator 100A and 100D have a slightly narrower length L2=0.98×L1 but the same width W2=W1 as inner resonator plates 100B and 100C. The four plates 100A-100D preferably have the same or substantially the same resonance frequency and, therefore, the plate widths of resonator plates 100A-100D should be equal or substantially equal to each other (i.e., W1=W2), according to an exemplary embodiment.

As shown above in FIG. 5B, these four individual resonator plates 100A-100D are connected along the lengths of the inner resonator plates 100B and 100C to make an overtone resonator 100 according to an exemplary embodiment. More particularly, resonator plate 100A has parallel long sides 102A and 104A and parallel shorter sides 106A and 108A. Similarly, resonator plate 100B has parallel long sides 102B and 104B and parallel shorter sides 106B and 108B, resonator plate 100C has parallel long sides 102C and 104C and parallel shorter sides 106C and 108C, and resonator plate 100D has parallel long sides 102D and 104D and parallel shorter sides 106D and 108D.

As shown, each of resonator plates 100A-100D are positioned in parallel to each other in the widthwise direction of the MEMS resonator 100. Thus, the long side 104A of resonator plate 100A is disposed adjacent to and parallel to long side 102B (i.e., the "outer" side) of resonator plate 100B, the long side 104B (i.e., the "inner" side) of resonator plate 100B is disposed adjacent to and parallel to long side 102C (i.e., the "inner" side) of resonator plate 100C, and the long side 104C (i.e., the "outer" side) of resonator plate 100C is disposed adjacent to and parallel to long side 102D of resonator plate 100D.

Furthermore, the shorter sides (extending in the width direction) of resonator plates 100B and 100C are not aligned with the shorter sides of resonator plates 100A and 100D. In other words, sides 106B and 106C are aligned with each other and sides 108B and 108C are aligned with each other. However, these sides are not aligned with sides 106A and 106D or 108A and 108D in the widthwise direction. As will be described in more detail below, due to the exemplary design with the resonator plates 100A-100D having varying lengths, the overtone resonator 100 is less susceptible to spurious responses.

As further shown, resonator plate 100B includes anchoring points 110 and 111 and resonator plate 100C includes anchoring points 112 and 113. Preferably, these anchoring points 110-113 are physically coupled to a frame (i.e., a support member) of the sensor device (not shown), such that the overtone resonator 100 is disposed in a cavity therein, as would be appreciated to one skilled in the art. Moreover, the anchoring points 110-113 are nodal points of vibration expansion in the width expansion mode, as described above.

Thus, as shown, the respective anchoring points are positioned at the center of each major surface of resonator plates 100B and 100C, respectively, and at central portions of the sides 106B, 106C, 108B and 108C.

It should be appreciated that while the inner resonator plates 100B and 100C are shown to have a longer length L1 than the length L2 of outer resonator plates 100A and 100D, and are shown to be centered relative to the outer resonator plates 100A and 100D, variations of this configuration can be employed according to alternative embodiments. For example, the resonators with shorter length (i.e., resonator plates 100A and 100D) may be in the center of overtone resonator 100 (i.e., as the "inner" resonator plates) with the longer resonator plates 100B and 100C as the "outer" resonators. Moreover, the longer and shorter resonator plates may be alternating in position according to another embodiment, i.e., resonator 100A, then resonator 100B, then resonator 100D, and then resonator 100C can be positioned in sequence. However, the overtone resonator 100 preferably has a symmetrical design as shown in FIG. 5B.

According to an exemplary embodiment, the overtone resonator 100 is a 96-MHz resonator that has dimensions of W1=W2=40 µm and lengths L1=240 µm and L2=0.98× L1=235 µm. In this embodiment, the variation in the plate lengths L1 and L2 does not disturb the desired width extensional-mode, but suppresses the undesirable bending modes.

Accordingly, while the range of length ratios may vary according to the exemplary design, the ratio is preferably provided as follows:

$$0.001 < \left|\frac{L1}{L2} - 1\right| < 0.1$$

and more preferably limited as follows:

$$0.002 < \left|\frac{L1}{L2} - 1\right| < 0.05.$$

Figure 4A:
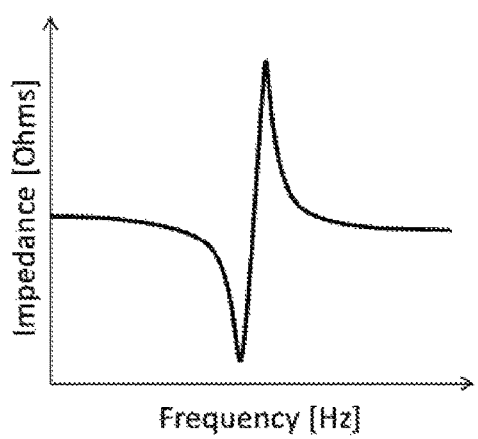
FIGS. 4A and 4B illustrate graphs of exemplary electrical resonator responses.
Figure 4B:
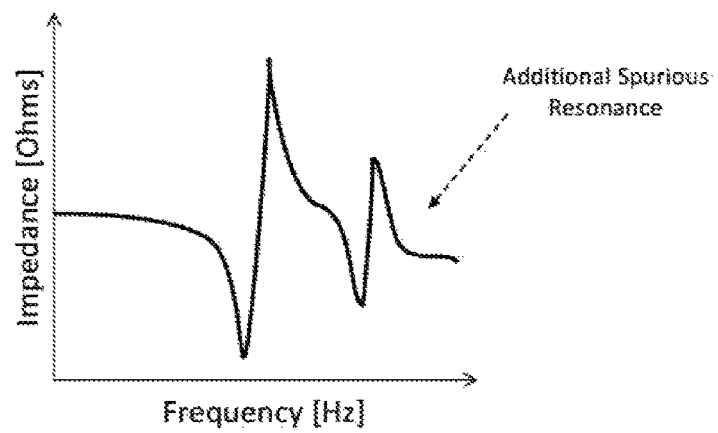
Figure 5C:
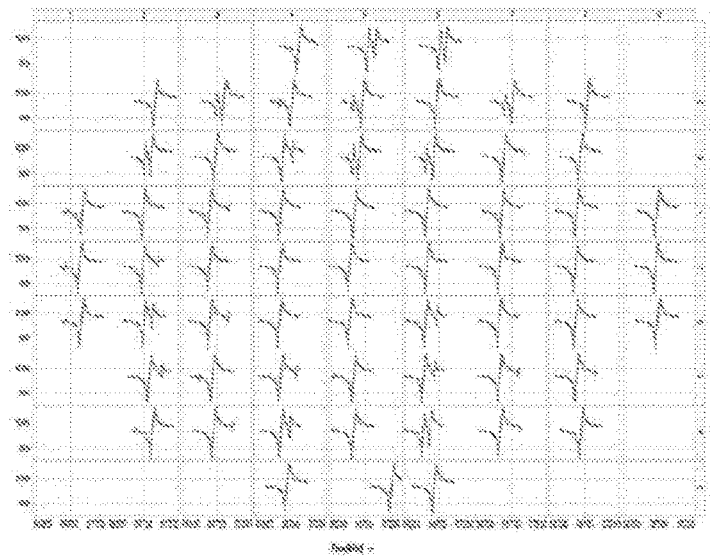
FIGS. 5C and 5D provide graphs illustrating measured spurious responses that compare conventional designs shown in FIG. 3B, for example, with the exemplary overtone resonator shown in FIG. 5B.
Figure 5D:
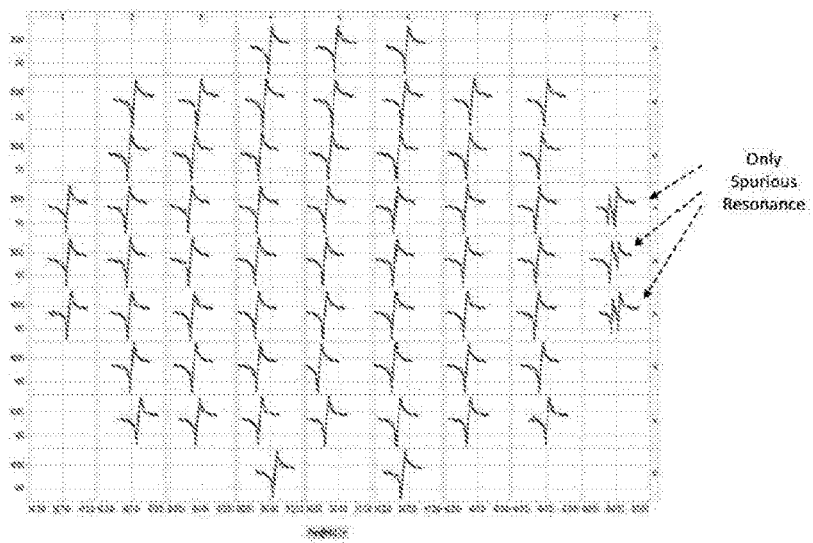

FIGS. 5C and 5D provide graphs illustrating measured spurious responses that compare conventional designs with the exemplary overtone resonator 100 described above. In particular, FIG. 5C illustrates a wafer map with measured impedance curves for conventional resonators (e.g., the design of FIG. 3B). As shown, more than half of the resonators manufactured would experience a spurious response (i.e., the spurious response shown in FIG. 4B). In contrast, FIG. 5D illustrates a wafer map with measured impedance curves for the exemplary resonators with the length L2 equals 0.98×length L1, as described above (i.e., the design of FIG. 5B). As shown, the exemplary design produces almost all resonators that do not experience spurious responses and rather have a clean response, such as that shown in FIG. 4A.

Figure 5E:
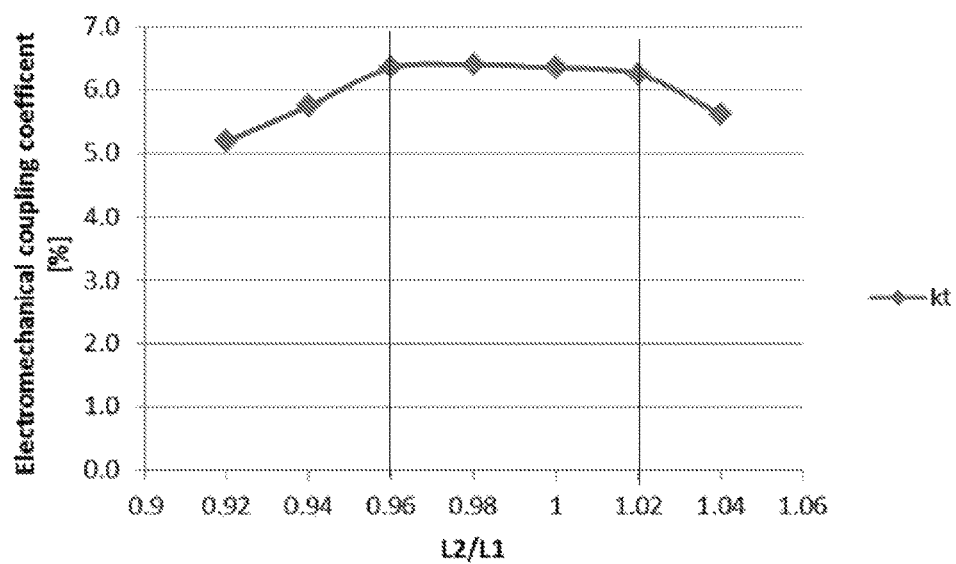
FIG. 5E illustrates a graph that compares the length ratio of the lengths of the outer resonators with the lengths of the inner resonators.

FIG. 5E illustrates a graph that compares the length ratio of the lengths of the outer resonator plates 100A and 100D (i.e., lengths L2) with the lengths of the inner resonator plates 100B and 100C (i.e., lengths L1). Specifically, the graph of FIG. 5E illustrates how this ratio L2/L1 effects the electromechanical coupling coefficient percentage. As shown when the ratio of L2/L1 is less than approximately 0.96 or greater than approximately 1.02, the coupling coefficient drops significantly indicating poor resonance vibration mode. In other words, a larger difference in the respective aspect ratios of the outer resonator plates 100A and 100D to the inner resonator plates 100B and 100C (and vice versa) would substantially disturb the desired width extensional mode resulting in a low quality factor.

Therefore, it should be appreciated that according to the exemplary embodiment L2/L1 should be greater than or equal to 0.96, but less than or equal to 1.02. As noted above, to also minimize spurious resonances, the length L2 does not equal length L1, but rather length L2 equals 0.98 times length L1 (and vice versa). A small difference would not effectively suppress the spurious modes while too large a difference would weaken the electrical characteristics of the desired mode.

As further described above, although the widths W1 and W2 can vary in some designs, according to the exemplary embodiment the widths W1 and W2 are equal or substantially equal so that the individual resonator plates 100A-100D used to construct the overtone resonator 100 have approximately the same resonant frequency. For example, in one embodiment, an exemplary range for width ratios is:

$$\left|\frac{W1}{W2} - 1\right| < 0.1.$$

Figures 6A, 6B:
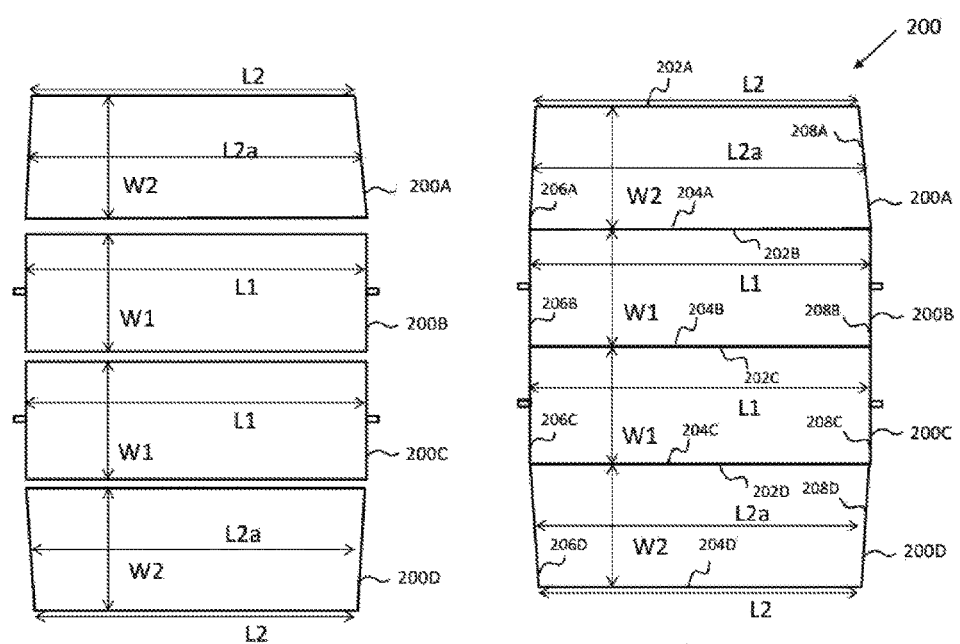
FIGS. 6A and 6B illustrate a top view of a MEMS resonator according to another exemplary embodiment.

FIGS. 6A and 6B illustrate a top view of a MEMS resonator according to another exemplary embodiment. As shown, an overtone resonator 200 is provided that includes a plurality of individual resonator plates 200A, 200B, 200C and 200D. According to the exemplary embodiment, inner resonator plates 200B and 200C are substantially rectangular shaped with widths W1 and lengths L1. For example, resonator plate 200B has long sides 202B and 204B each have a length L1 and shorted sides 206B and 208B each having a length equal to the width W1. Similarly, resonator plate 200C has long sides 202C and 204C each have a length L1 and shorted sides 206C and 208C each having a length equal to the width W1.

Moreover, the geometry or shape of the resonator plates 200A and 200D is slightly varied compared with the overtone resonator 100 in that resonator plates 200A and 200D each comprise a trapezoid shaped with width W2. As shown in FIG. 5B, for example, the longer length of resonator 200A (i.e., the inner side 204A disposed adjacent to the side 202B of resonator 200B) is the same length of resonator 200B, which is length L1. However, the outer side (i.e., side 202A) has a length of L2 that is shorter than length L1. Similarly, the longer side 202D of resonator 200D (i.e., the inner side positioned to the side 204C of resonator 200C) is the same length of resonator 200C, which is also length L1. However, the outer side 204D of resonator 200D has a length of L2 that is shorter than length L1. As a result, while sides 202A and 204A of resonator plate 200A extend in a parallel direction, sides 206A and 208A taper inward in the widthwise direction towards each other and, therefore, are not parallel to one another. Resonator plate 200D has the opposite configuration such that the overtone resonator 200 comprises an overall symmetrical shape in the widthwise direction.

According to the exemplary embodiment, the average length of the two trapezoid shaped resonator plates 200A and 200D is equal to L2a=(L1+L2)/2. Moreover, the four resonator plates 200A-200D shown in FIG. 6A are connected or positioned adjacent to each other as shown in FIG. 6B to make the exemplary overtone resonator 200. According to the exemplary embodiment, the length ratio defined in terms of the average length as L2a preferably satisfies the following:

$$0.001 < \left| \frac{L1}{L2a} - 1 \right| < 0.1.$$

In one aspect, it is noted that while each of the exemplary overtone resonators 100 and 200 described above are comprised of four individual resonators, the exemplary designs can be composed of four or more than four individual resonators to obtain the desired improved electrical characteristics, such as quality factor, while reducing and/or eliminating spurious resonances.

For example, FIGS. 7A and 7B illustrate a top view of a MEMS resonator according to yet another exemplary embodiment. As shown in FIG. 7A, the overtone resonator 300 is formed from five individual resonator plates 300A, 300B, 300C, 300D and 300E, with each resonator have a corresponding length and width. More particularly, resonator 300A has a length L1 and width W1, resonator 300B has a length L2 and width W2, resonator 300C has a length L3 and width W3, resonator 300D has a length L4 and width W4, and resonator 300E has a length L5 and width W5. As shown, each of the resonator plates 300A-300D have a substantially rectangular shape and are connected to each other along the longer sides as shown in FIG. 7B to form the overtone resonator 300.

According to an exemplary embodiment, the overtone resonator 300 has a symmetrical design in that at least length L2 of resonator 300B and length L4 of resonator 300D are equal to each other. Moreover, at least length L1 of resonator 300A and length L5 of resonator 300E are equal to each other. Furthermore, according to the exemplary embodiment, length L3 is preferably longer than length L1 and length L5, but shorter than length L2 and length L4. In this regard, the current embodiment can be applied to arbitrarily large overtone resonator (in terms of number of individual resonators) as long as at least a portion of the adjacent resonators satisfy the length criteria:

$$0.001 < \left| \frac{L_i}{L_{i+1}} - 1 \right| < 0.1,$$

In this embodiment, $L_i$ and $L_{i+1}$ are average lengths of adjacent resonators. That is $L_i$ can represent length L1 and $L_{i+1}$ can represent length L2 or $L_i$ can represent length L2 and $L_{i+1}$ can represent length L3, and so forth. Thus, the absolute value of the ratio of lengths of adjacent ratios minus 1 should be between 0.001 and 0.1 in this aspect in order to minimize spurious resonance. Moreover, according to this embodiment, the widths W1-W5 of the individual resonator plates 300A-300E are preferably equal or substantially equal so that the individual resonators used to construct the overtone resonator 300 have approximately the same resonant frequency.

Figures 8A, 8B:
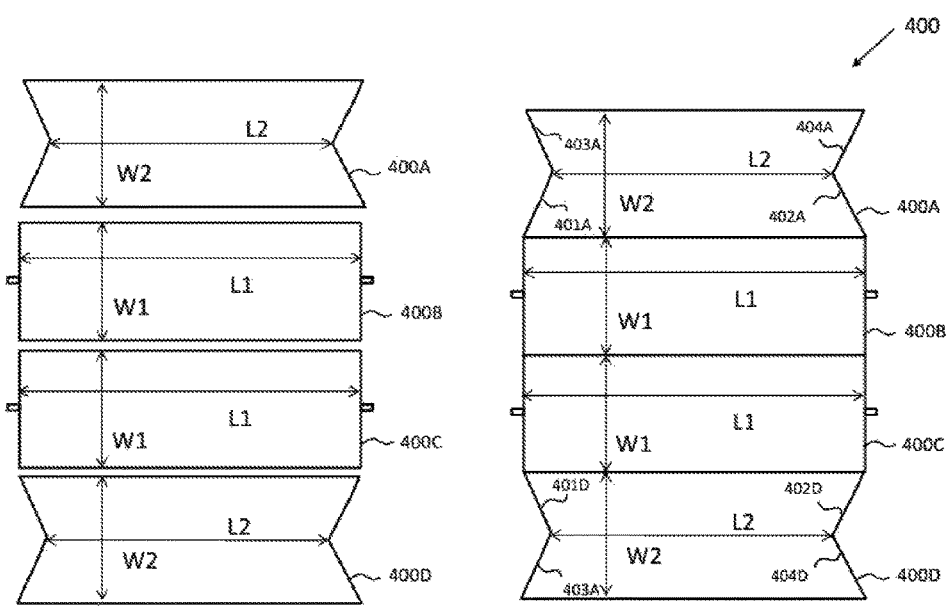
FIGS. 8A and 8B illustrate a top view of a MEMS resonator according to another exemplary embodiment.

FIGS. 8A and 8B illustrate a top view of a MEMS resonator according to another exemplary embodiment. As shown, the MEMS resonator includes the same design of FIGS. 6A and 6B in that a first pair of resonator plates 400B and 400C are rectangular shaped with width W1 and length L1. Moreover, the long sides of these resonator plates extend parallel to each other. Similarly, the long sides of resonator plates 400A and 400D are also parallel and have the same length L1 as resonator plates 400B and 400C.

However, as further shown, the shorter sides of resonator plates 400A and 400D are not parallel to each other, by instead have concave sides directed inward. For example, the four resonator plates 400A through 400D are combined as shown in FIG. 8B to form a fourth-order overtone resonator 400. However, the shorter sides of resonator plate 400A include inward tapered sides portions 401A and 402A and outward tapered side portions 403A and 404A. Thus, the length of the resonator plate 400A narrows from length L1 to length L2 at its narrowest point before tapering outward. Similarly, the shorter sides of resonator plate 400D include inward tapered sides portions 401D and 402D and outward tapered side portions 403D and 404D. Thus, the length of the resonator plate 400D also narrows from length L1 to length L2 at its narrowest point before tapering outward.

According to the exemplary embodiment, the average length of the resonator plates 400A and 400D is L2a=(L1+L2)/2. In this case, the length ratio defined in terms of the average length as L2a and in exemplary embodiment satisfies the following:

$$0.001 < \left| \frac{L1}{L2a} - 1 \right| < 0.1.$$

It should be appreciated that many different outer shapes are possible for the short side of the individual resonator plates 400A and 400D, including but not limiting to concave shapes and convex shapes. Thus, while straight linear side portions are shown as 401A-404A and 401D-404D, these sides can be curved in a convex or concave design in an alternative embodiment. Moreover, according to this embodiment, the widths W1 and W2 of the individual resonator plates 400A-400D are preferably equal or substantially equal so that the individual resonators used to construct the overtone resonator 400 have approximately the same resonant frequency.

In the interest of clarity, not all of the routine features of the embodiments are disclosed herein. It should be appreciated that in the development of any actual implementation of the present disclosure, numerous implementation-specific decisions must be made in order to achieve the designer's specific goals, and these specific goals will vary for different implementations and different designers. It is understood that such a design effort might be complex and time-consuming, but would nevertheless be a routine undertaking of engineering for those of ordinary skill in the art, having the benefit of this disclosure.

Furthermore, it is to be understood that the phraseology or terminology used herein is for the purpose of description and not of restriction, such that the terminology or phraseology of the present specification is to be interpreted by those skilled in the art in light of the teachings and guidance presented herein, in combination with the knowledge of the skilled in the relevant art(s). Moreover, it is not intended for any term in the specification or claims to be ascribed an uncommon or special meaning unless explicitly set forth as such.

While the foregoing has been described in conjunction with exemplary embodiments, it is understood that the term "exemplary" is merely meant as an example. Accordingly, the application is intended to cover alternatives, modifications and equivalents, which may be included within the spirit and scope of the MEMS resonator disclosed herein.

REFERENCE SIGNS LIST 100, 200, 300, 400: Overtone Resonators
100A, 100B, 100C, 100D: Resonator Plates
200A, 200B, 200C, 200D: Resonator Plates
300A, 300B, 300C, 300D: Resonator Plates
400A, 400B, 400C, 400D: Resonator Plates
102A, 104A, 102B, 104B, 102C, 104C, 102D, 104D: Long sides of resonator plates
106A, 108A, 106B, 108B, 106C, 106D, 108C, 108D: Short sides of resonator plates
110, 111, 112, 112: Anchoring points
202A, 204A, 202B, 204B, 202C, 204C, 202D, 204D: Long sides of resonator plates
206A, 208A, 206B, 208B, 206C, 206D, 208C, 208D: Short sides of resonator plates
401A, 402A, 403A, 404A, 401D, 402D, 403D, 404D: short side portions of resonator plates

What is claimed:

1. A microelectromechanical system ("MEMS") resonator comprising:
a plurality of first resonator plates each having a width W1 and a length L1, wherein the length L1>the width W1, and the plurality of first resonator plates have a pair of longer sides with a length equal to the length L1 and a pair of shorter sides with a length equal to width W1; and
a plurality of second resonator plates each having a width W2 and a length L2, wherein the length L2>the width W2, and the plurality of second resonator plates have a pair of longer sides with a length equal to the length L2 and a pair of shorter sides with a length equal to width W2,
wherein the plurality of first resonator plates and the plurality of second resonator plates are disposed parallel to each other in a widthwise direction of the MEMS resonator, with at least one longer side of each of the plurality of first and second resonator plates being coupled to at least one longer side of an adjacent resonator plate such that the first and second resonator plates are stacked in the widthwise direction,
wherein at least a portion of the first and second resonator plates comprise respective anchoring points on the shorter sides of the respective resonator plate, such that the MEMS resonator is configured as a width extensional mode resonator, and
wherein the length L1 is not equal to the length L2.

2. The MEMS resonator according to claim 1, wherein the plurality of second resonator plates comprise at least a pair of second resonator plates that are respectively disposed adjacent to outer sides in the widthwise direction of at least a pair of the plurality of first resonator plates.

3. The MEMS resonator according to claim 2, wherein the pair of first resonator plates are disposed adjacent to each other at respective inner sides in the widthwise direction of the first resonator plates, the inners sides being opposite to the outer sides.

4. The MEMS resonator according to claim 2, wherein the MEMS resonator comprises a symmetric shape such that the plurality of second resonator plates are aligned symmetrically relative to the plurality of first resonator plates in the widthwise direction.

5. The MEMS resonator according to claim 2, wherein the length L2 of each of the second resonator plates is substantially equal to 0.98× the length L1 of the first resonator plates.

6. The MEMS resonator according to claim 5, wherein the width W1 of each of the first resonator plates is substantially equal to the width W2 of each of the second resonator plates.

7. The MEMS resonator according to claim 2, further comprising at least one third resonator plate having a length L3 that is not equal to the length L1 or the length L2.

8. The MEMS resonator according to claim 7, wherein the lengths L1, L2 and L3 of the respective resonator plates satisfy the following:

$$0.001 < \left|\frac{L_i}{L_{i+1}} - 1\right| < 0.1,$$

wherein i and i+1 are any two adjacent resonator plates of the MEMS resonator, and
wherein $L_i$ and $L_{i+1}$ are average lengths of at least a pair of adjacent resonator plates in the widthwise direction.

9. The MEMS resonator according to claim 1, wherein the length L2 of each of the second resonator plates is substantially equal to 0.98× the length L1 of the first resonator plates.

10. The MEMS resonator according to claim 1, wherein the length L1 of each of the first resonator plates and the length L2 of each of the second resonator plates satisfies the following:

$$0.001 < \left|\frac{L1}{L2} - 1\right| < 0.1.$$

11. The MEMS resonator according to claim 10, wherein the width W1 of each of the first resonator plates and the width W2 of each of the second resonator plates satisfies the following:

$$\left|\frac{W1}{W2} - 1\right| < 0.1.$$

12. The MEMS resonator according to claim 11, wherein the length L1 of each of the first resonator plates and the length L2 of each of the second resonator plates satisfies the following:

$$0.002 < \left|\frac{L1}{L2} - 1\right| < 0.05.$$

13. A microelectromechanical system ("MEMS") resonator comprising:
a plurality of inner resonator plates each having a width W1 and a length L1 that is greater than the width W1, wherein the inner resonator plates are disposed adjacent to each other along respective first longer sides of the inner resonator plates; and
a plurality of outer resonator plates each having a width W2 and a length L2 that is greater than the width W2, wherein at least a pair of the outer resonator plates are disposed adjacent to respective second longer sides of a pair of the inner resonator plates, wherein the second sides of the pair of inner resonator plates are opposite the first sides, respectively, in the widthwise direction of the MEMS resonator, such that the first and second resonator plates are stacked in the widthwise direction, wherein at least a portion of the inner resonator plates comprise respective anchoring points on the shorter sides of the respective resonator plate, such that the MEMS resonator is configured as a width extensional mode resonator, and wherein the length L1 is not equal to the length L2.

14. The MEMS resonator according to claim 13, wherein the length L2 of each of the outer resonator plates is substantially equal to 0.98× the length L1 of the inner resonator plates.

15. The MEMS resonator according to claim 13, wherein the length L1 of each of the inner resonator plates and the length L2 of each of the outer resonator plates satisfies the following:

$$0.001 < \left|\frac{L1}{L2} - 1\right| < 0.1.$$

16. A microelectromechanical system ("MEMS") resonator comprising:

a plurality of first resonator plates each being rectangular shaped and having a pair of longer sides with a length L1 and a pair of shorter sides with a width W1, wherein the length L1>the width W1; and a plurality of second resonator plates each having a pair of first sides extending in a direction parallel to each other and a pair of second sides connecting the pair of first sides, respectively, the pair of second sides not extending in a direction parallel to each other, wherein the plurality of first resonator plates and the plurality of second resonator plates are disposed parallel to each other in a widthwise direction of the MEMS resonator, with at least one longer side of each of the plurality of first and second resonator plates being coupled to at least one longer side of an adjacent resonator plate such that the first and second resonator plates are stacked in the widthwise direction, and wherein at least a portion of the plurality of first resonator plates comprise respective anchoring points on the shorter sides thereof, such that the MEMS resonator is configured as a width extensional mode resonator.

17. The MEMS resonator according to claim 16, wherein the plurality of second resonator plates are trapezoid shaped, wherein each of the second resonator plates includes one side of the pair of first sides having a length L1 and the other side of the pair of first sides having a length L2<the length L1.

18. The MEMS resonator according to claim 17, wherein the plurality of second resonator plates comprise at least a pair of second resonator plates that are respectively disposed adjacent to outer sides in the widthwise direction of a pair of the plurality of first resonator plates.

19. The MEMS resonator according to claim 17, wherein the plurality of second resonator plates each comprise an average length that is substantially equal to L2a=(L1+L2)/2, and wherein the average length satisfies the following:

$$0.001 < \left|\frac{L1}{L2a} - 1\right| < 0.1.$$

20. The MEMS resonator according to claim 16, wherein the each side of the pair of second sides of the second resonator plates is concave shaped.

* * * * *